(12) United States Patent
Hanada et al.

(10) Patent No.: US 10,824,211 B2
(45) Date of Patent: Nov. 3, 2020

(54) SEMICONDUCTOR DEVICE

(71) Applicant: Japan Display Inc., Minato-ku (JP)

(72) Inventors: Akihiro Hanada, Tokyo (JP); Hajime Watakabe, Tokyo (JP); Kazufumi Watabe, Tokyo (JP)

(73) Assignee: Japan Display Inc., Minato-ku (JP)

(*) Notice: Subject to any disclaimer, the term of this patent is extended or adjusted under 35 U.S.C. 154(b) by 11 days.

(21) Appl. No.: 16/131,477

(22) Filed: Sep. 14, 2018

(65) Prior Publication Data

US 2019/0041932 A1 Feb. 7, 2019

Related U.S. Application Data

(63) Continuation of application No. 15/405,511, filed on Jan. 13, 2017, now Pat. No. 10,115,740.

(30) Foreign Application Priority Data

Jan. 15, 2016 (JP) .................................. 2016-006123

(51) Int. Cl.
*H01L 27/12* (2006.01)
*H04L 29/08* (2006.01)
(Continued)

(52) U.S. Cl.
CPC ............ *G06F 1/26* (2013.01); *H01L 27/1225* (2013.01); *H01L 27/1237* (2013.01);
(Continued)

(58) Field of Classification Search
CPC ....... H01L 2029/42388; H01L 27/1225; H01L 27/1237; H01L 27/1248; H01L 27/1251;
(Continued)

(56) References Cited

U.S. PATENT DOCUMENTS

2003/0122196 A1 7/2003 Hwang
2007/0152217 A1 7/2007 Lai
(Continued)

FOREIGN PATENT DOCUMENTS

JP 2012-216806 A 11/2012
JP 2013-179295 A 9/2013
(Continued)

OTHER PUBLICATIONS

Japanese Office Action dated Sep. 3, 2019, in Patent Application No. 2016-006123, citing documents AO-AT therein, 10 pages (with unedited computer generated English translation).
(Continued)

*Primary Examiner* — Duy T Nguyen
(74) *Attorney, Agent, or Firm* — Oblon, McClelland, Maier & Neustadt, L.L.P.

(57) ABSTRACT

According to one embodiment, a semiconductor device includes an insulating substrate, a first semiconductor layer formed of silicon and positioned above the insulating substrate, a second semiconductor layer formed of a metal oxide and positioned above the first semiconductor layer, a first insulating film formed of a silicon nitride and positioned between the first semiconductor layer and the second semiconductor layer, and a block layer positioned between the first semiconductor film and the second semiconductor layer, the block layer hydrogen diffusion of which is lower than that of the first insulating film.

15 Claims, 9 Drawing Sheets

(51) Int. Cl.
*H01L 29/786* (2006.01)
*H01L 29/423* (2006.01)
*H01L 29/51* (2006.01)
*G06F 1/26* (2006.01)
*H02J 13/00* (2006.01)
*H04L 12/24* (2006.01)
*H04L 12/853* (2013.01)
*H04Q 9/02* (2006.01)

(52) U.S. Cl.
CPC ...... *H01L 27/1248* (2013.01); *H01L 27/1251* (2013.01); *H02J 13/0062* (2013.01); *H04L 41/069* (2013.01); *H04L 47/2416* (2013.01); *H04L 67/12* (2013.01); *H01L 29/42384* (2013.01); *H01L 29/513* (2013.01); *H01L 29/517* (2013.01); *H01L 29/518* (2013.01); *H01L 29/7869* (2013.01); *H01L 29/78606* (2013.01); *H01L 29/78633* (2013.01); *H01L 29/78675* (2013.01); *H01L 2029/42388* (2013.01); *H04Q 9/02* (2013.01); *H04Q 2209/826* (2013.01)

(58) Field of Classification Search
CPC ............. H01L 29/42384; H01L 29/513; H01L 29/517; H01L 29/518; H01L 29/78606; H01L 29/78633; H01L 29/78675; H01L 29/7869
USPC .......................................................... 257/43
See application file for complete search history.

(56) References Cited

U.S. PATENT DOCUMENTS

| | | |
|---|---|---|
| 2013/0105791 A1 | 5/2013 | Honda |
| 2014/0008647 A1* | 1/2014 | Yamazaki ........... H01L 29/7869 257/43 |
| 2015/0053935 A1 | 2/2015 | Gupta et al. |
| 2015/0054799 A1 | 2/2015 | Chang et al. |
| 2015/0055047 A1 | 2/2015 | Chang et al. |
| 2015/0055051 A1 | 2/2015 | Osawa et al. |
| 2015/0108470 A1 | 4/2015 | Yamazaki et al. |
| 2015/0184286 A1 | 7/2015 | Barabash |
| 2015/0243689 A1 | 8/2015 | Lee |
| 2016/0087022 A1 | 3/2016 | Tsai et al. |

FOREIGN PATENT DOCUMENTS

| | | |
|---|---|---|
| JP | 2013-225620 A | 10/2013 |
| JP | 2015-15458 A | 1/2015 |
| JP | 2015-179838 A | 10/2015 |
| JP | 2015-207764 A | 11/2015 |
| WO | WO 2015/031037 A1 | 3/2015 |

OTHER PUBLICATIONS

Office Action dated Dec. 3, 2019 in corresponding Japanese Patent Application No. 2016-006123 (English Translation only), 4 pages.
Combined Chinese Office Action and Search Report dated Jan. 9, 2020 in corresponding Chinese Patent Application No. 201710022300.3 (English Translation only), 12 pages.

* cited by examiner

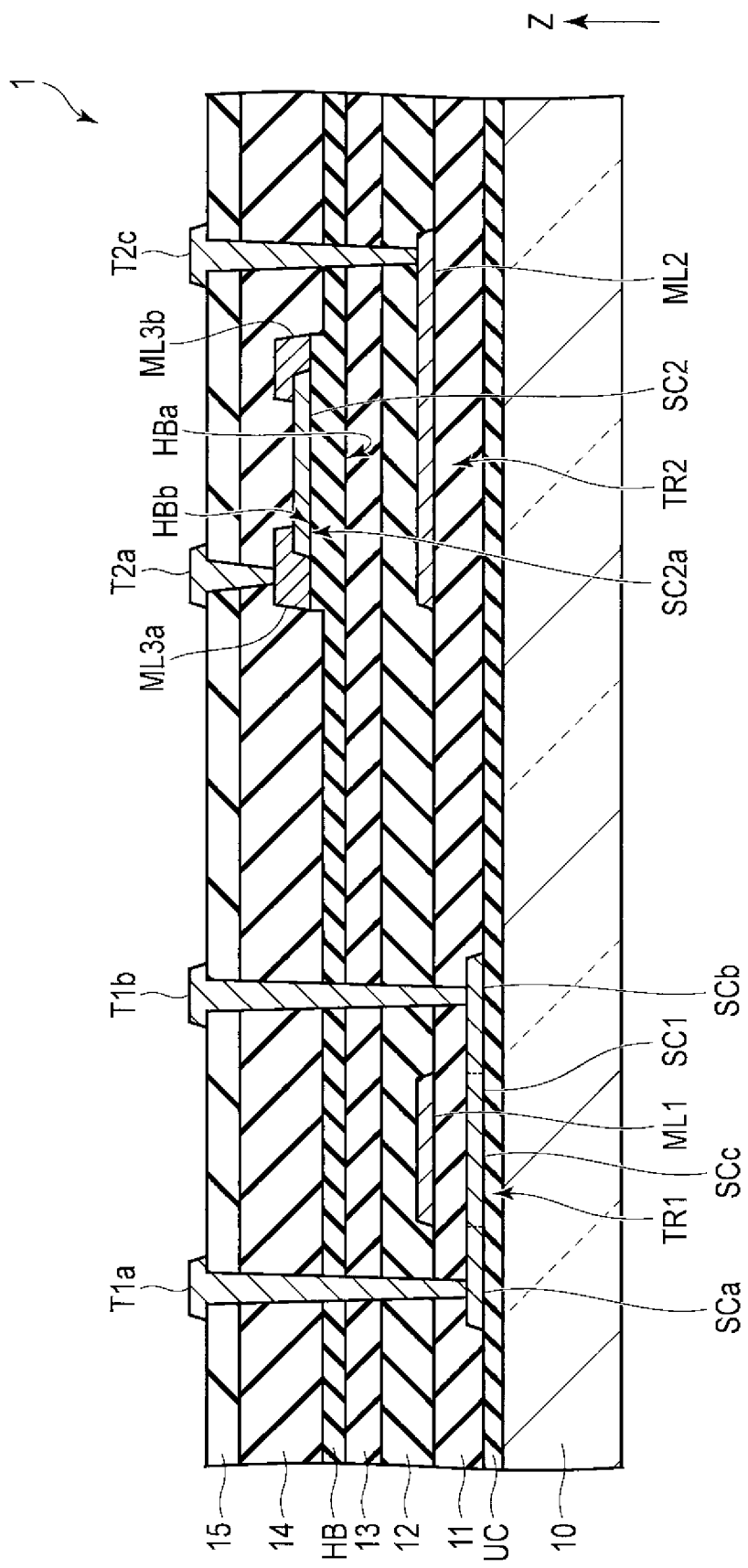
F I G. 1

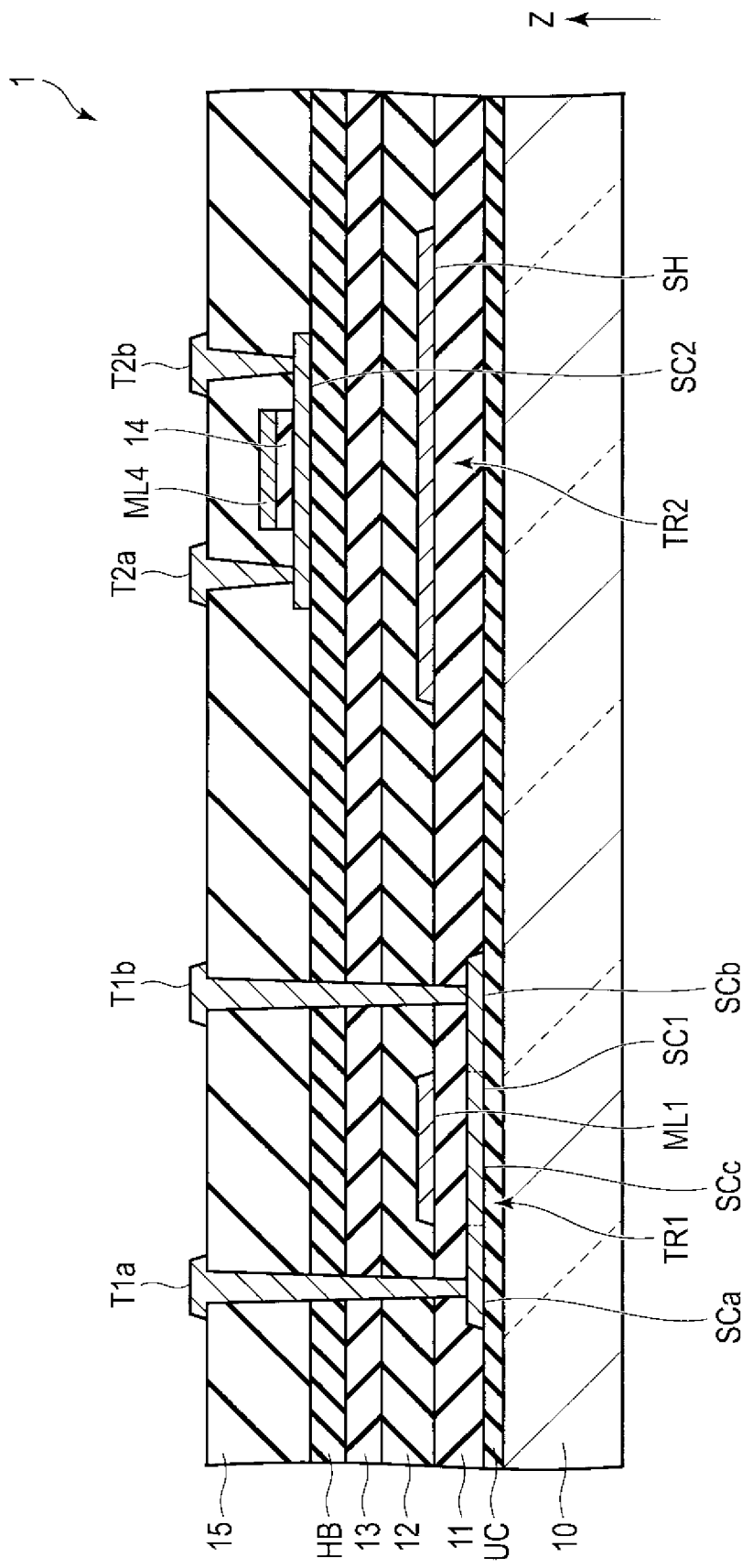
F I G. 5

SEMICONDUCTOR DEVICE

CROSS-REFERENCE TO RELATED APPLICATIONS

This application is a continuation of U.S. application Ser. No. 15/405,511 filed Jan. 13, 2017, and is based upon and claims the benefit of priority from Japanese Patent Application No. 2016-006123, filed Jan. 15, 2016, the entire contents of each of which are incorporated herein by reference.

FIELD

Embodiments described herein relate generally to a semiconductor device.

BACKGROUND

Thin film transistors show various properties depending on materials used in a semiconductor layer therein. For example, if a low temperature polysilicon semiconductor is used as the semiconductor layer, a thin film transistor of good reliability can be achieved. Furthermore, if a oxide semiconductor is used as the semiconductor layer, a thin film transistor of a small off current can be achieved. If a thin film transistor including a polysilicon semiconductor layer and a thin film transistor including an oxide semiconductor layer are formed on the same substrate, the oxide semiconductor layer may become low resistive because of hydrogen diffusion from the polysilicon semiconductor layer to the oxide semiconductor layer, and a desired property may not be obtained.

BRIEF DESCRIPTION OF THE DRAWINGS

FIG. 1 is a cross-sectional view of the structure of a semiconductor device of an embodiment.

FIG. 5 is a cross-sectional view of a variation in which a thin film transistor TR2 is of top gate structure.

DETAILED DESCRIPTION

Figure 2:
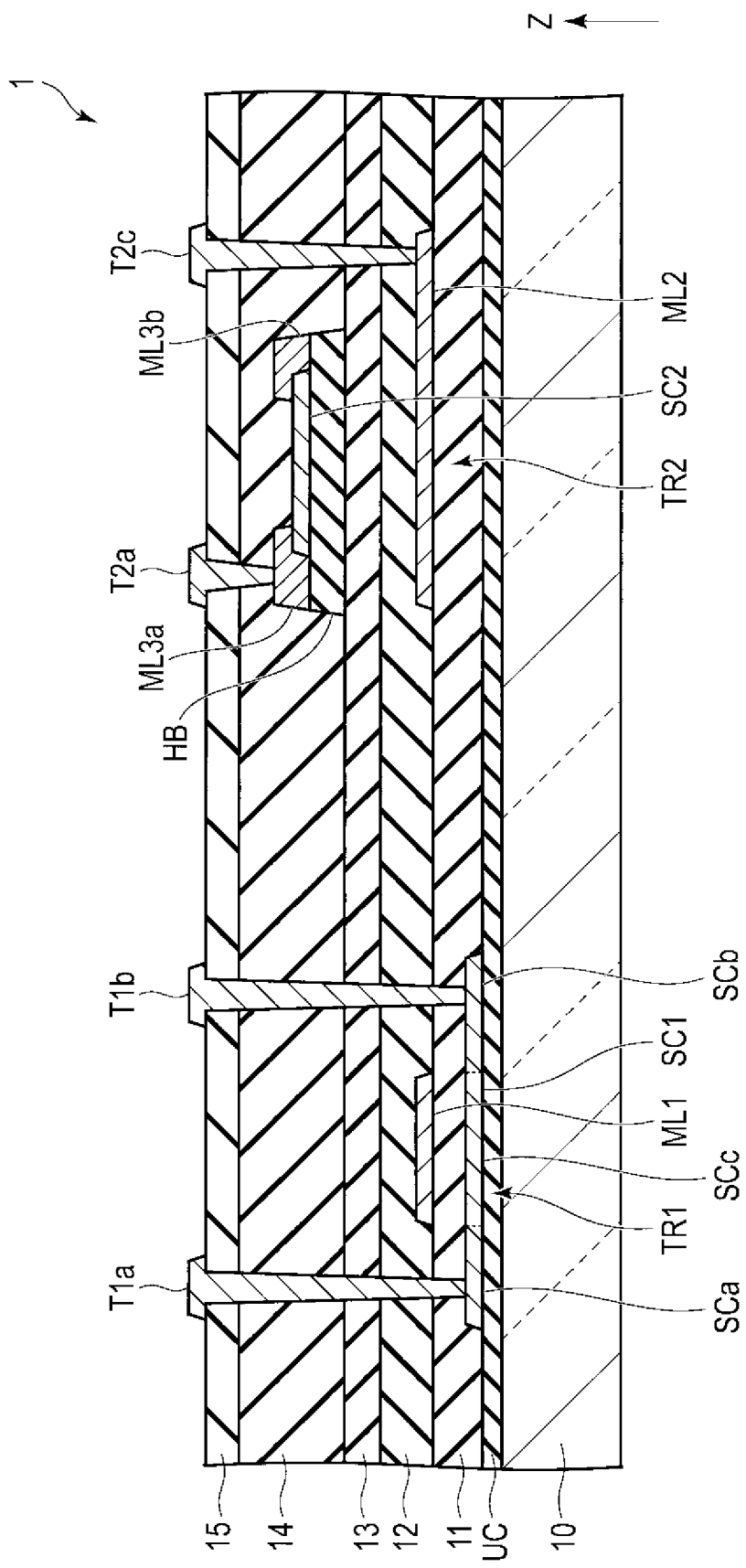
FIG. 2 is a cross-sectional view of a variation in which a block layer is patterned.

In general, according to one embodiment, a semiconductor device includes an insulating substrate, a first semiconductor layer formed of silicon and positioned above the insulating substrate, a second semiconductor layer formed of a metal oxide and positioned above the first semiconductor layer, a first insulating film formed of a silicon nitride and positioned between the first semiconductor layer and the second semiconductor layer, and a block layer positioned between the first semiconductor film and the second semiconductor layer, the block layer hydrogen diffusion of which is lower than that of the first insulating film.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

Note that, in the description of the present application, above (or up) corresponds to the direction of the arrow of the direction Z, and below (or down) corresponds to the opposite direction of the arrow of the direction Z.

FIG. 1 is a cross-sectional view of the structure of a semiconductor device of an embodiment. The semiconductor device 1 depicted is a thin film transistor (TFT) substrate including a plurality of thin film transistors TR1 and TR2.

The semiconductor device 1 includes, for example, an insulating substrate 10, undercoat layer UC, semiconductor layer SC1, insulating film 11, gate electrode ML1, gate electrode ML2, insulating film 12, insulating film 13, block layer HB, semiconductor layer SC2, insulating film 14, and insulating film 15. Note that the insulating films 11 to 15 may be referred to as first insulating film, second insulating film, third insulating film, . . . and/or interlayer insulating film. This includes that the insulating film 11 is referred to as interlayer insulating film, insulating film 12 is referred to as first insulating film, insulating film 13 is referred to as second insulating film, and fourth insulating film 14 is referred to as interlayer insulating film. Furthermore, the semiconductor layer SC1 may be referred to as first semiconductor layer and the semiconductor layer SC2 may be referred to as second semiconductor layer.

The insulating substrate 10 is formed of, for example, a light-transmissive glass substrate or light-transmissive resin substrate. An insulating undercoat layer UC is disposed on the insulating substrate 10. The undercoat layer UC may be a monolayer or a multilayer, and the multilayer includes, for example, a silicon nitride layer and a silicon oxide layer.

The semiconductor layer SC1 is disposed above the insulating substrate 10. In the example depicted, the semiconductor layer SC1 is formed on the undercoat layer UC. The semiconductor layer SC1 is disposed between the insulating substrate 10 and the block layer HB. The semiconductor layer SC1 is formed of a silicon semiconductor, and in the example depicted, is formed of a polycrystalline silicon (polysilicon). The semiconductor layer SC1 includes a high resistance area SCc and low resistance areas SCa and SCb resistance of which is lower than that of the high resistance area SCc. The low resistance areas SCa and SCb are positioned at the ends of the high resistance area SCc. The low resistance areas SCa and SCb contain ionic impurities concentrated higher than that of the high resistance area SCc.

The insulating film 11 covers the semiconductor layer SC1. In the example depicted, the insulating film 11 is disposed above the undercoat layer UC. For example, the insulating film 11 is formed of a silicon oxide.

The gate electrode ML1 is disposed on the insulating film 11 and is opposed to the semiconductor layer SC1 with the insulating film 11 interposed therebetween. The gate electrode ML1 is opposed to the high resistance area SCc of the semiconductor layer SC1. The gate electrode ML2 is disposed above the insulating film 11 and is apart from the gate electrode ML1. The gate electrodes ML1 and ML2 each include a metal layer of good conductivity. In the example depicted, the gate electrodes ML1 and ML2 are formed on the same layer, and thus, they can be manufactured at the same time with the same material.

The insulating film 12 is disposed between the semiconductor layer SC1 and the semiconductor layer SC2. The insulating film 12 is disposed on the insulating film 11 to cover the gate electrodes ML1 and ML2. The insulating film 12 is formed of an insulative material containing hydrogen therein. In this example, the insulating film 12 is formed of a silicon nitride.

The insulating film 13 is disposed above the insulating film 12. In the example depicted, the insulating film 13 is disposed between the insulating film 12 and the block layer HB, and contacts the lower surface HBa of the block layer HB which will be described later. The insulating film 13 is preferably formed of a material which can release oxygen in a high temperature such as a silicon oxide.

The block layer HB is disposed between the insulating film 12 and the semiconductor layer SC2. The block layer HB includes the lower surface HBa opposed to the insulating substrate 10 and the upper surface HBb disposed in the opposite side of the lower surface HBa. In the example depicted, the block layer HB is disposed on the insulating film 13. In the example depicted, the block layer HB continuously extends to a position opposed to the semiconductor layer SC1 and a position opposed to the semiconductor layer SC2. The block layer HB exerts hydrogen diffusion lower than the insulating film 12 and the insulating film 13. Therefore, the block layer HB can suppress diffusion of hydrogen from one surface of the block layer HB to the other surface thereof. In the example depicted, the block layer HB can suppress the hydrogen diffusion from the insulating films 11, 12, and 13, undercoat layer UC, and semiconductor layer SC1 positioned in the lower surface HBa side to the semiconductor layer SC2 positioned in the upper surface HBb side.

The block layer HB may have an even thickness or an uneven thickness. In the example depicted, the block layer HB has steps in the upper surface HBb in positions opposed to outer edges of electrodes ML3a and ML3b which will be described later, and thus, the thickness of the area opposed to the semiconductor layer SC2 is greater than the thickness of the area opposed to the semiconductor layer SC1. The block layer HB is preferably formed of an insulating material in order to suppress the formation of an unnecessary capacitance with a conductive member such as gate electrode ML1 or semiconductor layer SC1 and to prevent a short of a channel layer when the upper surface HBb of the block layer HB and the lower surface SC2a of the semiconductor layer SC2 contact. The block layer HB is formed of a metal oxide such as $AlO_x$, $TiO_x$, $ZrO_x$, $TaO_x$, or $HfO_x$, or $SiN_x$ or SiON which contains $SiF_4$ as its base material and low hydrogen. In consideration of hydrogen blocking performance and light transmissivity, the block layer HB is preferably formed of aluminum oxide ($AlO_x$).

The semiconductor layer SC2 is disposed above the semiconductor layer SC1 than is the insulating substrate 10. The semiconductor layer SC2 has the lower surface SC2a to be opposed to the insulating substrate 10. In the example depicted, the semiconductor layer SC2 is disposed on the block layer HB and contacts the upper surface HBb of the block layer HR. The semiconductor layer SC2 is opposed to the gate electrode ML2. The semiconductor layer SC2 is formed of a semiconductor of metal oxide. In consideration of semiconductor performance, the metal oxide in the semiconductor layer SC2 preferably contains at least one of indiu, gallium, zinc, and tin. One end of the semiconductor layer SC2 contacts the electrode ML3a and the other end contacts the electrode ML3b. In the example depicted, the electrodes ML3a and ML3b extend to the outside of the semiconductor layer SC2 to be positioned above the block layer HB.

The insulating film 14 is disposed on the block layer HB and covers the semiconductor layer SC2 and the electrodes ML3a and ML3b. The insulating film 14 is formed of, for example, silicon oxide and is formed thicker than the insulating films 11, 12, and 13.

The insulating film 15 is disposed on the insulating film 14. The insulating film 15 is formed of, for example, silicon nitride. Note that the insulating film 15 preferably exerts a high vapor barrier in order to prevent moisture from entering from the above.

Terminals T1a, T1b, T2a, and T2c are disposed on the insulating film 15. Terminals T1a and T1b are each formed to pass through the insulating films 11, 12, 13, 14, and 15 and block layer HB, and are electrically connected to low resistance areas SCa and SCb of the semiconductor layer SC1. Terminal T2a is formed to pass through the insulating films 14 and 15 and is electrically connected to the electrode ML3a. Terminal T2c is formed to pass through the insulating films 12, 13, 14, and 15 and block layer HB and is electrically connected to the gate electrode ML2. Terminals T1a, T1b, T2a, and T2c are electrically connected to lines or the like which are not depicted in the figure.

In the example depicted, the thin film transistor TR1 is a top gate thin film transistor in which the gate electrode ML1 is disposed above the semiconductor layer SC1. Furthermore, a thin film transistor TR2 is a bottom gate thin film transistor in which the gate electrode ML2 is disposed below the semiconductor layer SC2. Note that the structure of each of the thin film transistors TR1 and TR2 is not limited to the above example, and the thin film transistor TR1 may be of bottom gate type and the thin film transistor TR2 may be of top gate type.

As above, in the present embodiment, the semiconductor device 1 includes the insulating substrate 10, silicon semiconductor layer SC1, metal oxide semiconductor layer SC2, silicon nitride insulating film 12 between the semiconductor layer SC1 and the semiconductor layer SC2, and block layer HB between the insulating film 12 and the semiconductor layer SC2. Thus, the hydrogen diffusion from the semiconductor layer SC1 and the insulating film 12 to the semiconductor layer SC2. That is, reduction of the semiconductor layer SC2 by hydrogen can be suppressed and degradation of reliability of the thin film transistor TR2 can be suppressed, too.

The semiconductor layer SC1 is disposed between the insulating substrate 10 and the block layer HB. Thus, in a manufacturing process where each member is laminated on the insulating substrate 10, the formation and activation of the semiconductor layer SC1 can be performed before forming the semiconductor layer SC2. Thereby, a change in components of the semiconductor layer SC2 caused by heat applied in the activation process of the semiconductor layer SC1 can be prevented. Thus, degradation of reliability of the thin film transistor TR2 can be suppressed.

The semiconductor layer SC2 contacts the block layer HB and hydrogen entering the semiconductor layer SC1 from the lower surface SC2a side can further be blocked. Furthermore, the block layer HB continuously extends to a position opposed to the semiconductor layer SC1 and a position opposed to the semiconductor layer SC2, and thus, the hydrogen diffusion to the above structure from the insulating film 12 and the semiconductor layer SC1 can be suppressed more effectively.

The semiconductor device 1 further includes the gate electrodes ML1 and ML2. The gate electrodes ML1 and ML2 are disposed on the same layer (insulating film 11) and are formed of the same material. Thus, the gate electrodes ML1 and ML2 can be formed in the same process. That is, the semiconductor device 1 can be manufactured through lesser processes with lesser costs.

The block layer HB is formed of, for example, an aluminum oxide, and thus, the block layer HB can be formed by using aluminum formation rate of which is higher than aluminum oxide and oxidizing the aluminum through an annealing process. Therefore, a time used for manufacturing the semiconductor device 1 can be reduced. Furthermore, if the block layer HB of aluminum oxide contacts the semiconductor layer SC2, aluminum is diffused from the block layer HB to the semiconductor layer SC2 and carriers are supplied, and thus, the mobility of the semiconductor layer SC2 can be improved.

Now, variations of the present embodiment will be explained with reference to FIGS. 2 to 4. Note that the advantages obtained in the above embodiment can be achieved in these variations.

FIG. 2 is a cross-sectional view of a variation in which the block layer is patterned.

In the variation, the block layer HB is patterned to have an island shape. In this respect, the variation differs from the example of FIG. 1.

In the example depicted, the block layer HB are formed as islands in the area opposed to the entire surface of the semiconductor layer SC2 and the area opposed to the electrodes ML3a and ML3b. The block layer HB is not formed in the other area, and is not opposed to the semiconductor layer SC1, for example. The block layer HB depicted can be patterned using the semiconductor layer SC2 and the electrodes ML3a and ML3b as a mask. Note that, if the block layer HB is formed in an island shape, the area of the block layer HB is preferably formed larger than that of the semiconductor layer SC2 in order to block hydrogen entering the semiconductor layer SC2.

In this variation, the block layer HB is patterned as islands, and the number of interfaces in the areas between thin film transistors can be reduced. Thereby, the transmissivity of the areas between the thin film transistors can be improved in this variation. If the semiconductor device 1 of the present embodiment is applied to a transmissive display device, the areas between thin film transistors correspond to openings through which light passes, and thus, a display device of high luminosity can be achieved.

Figure 3:
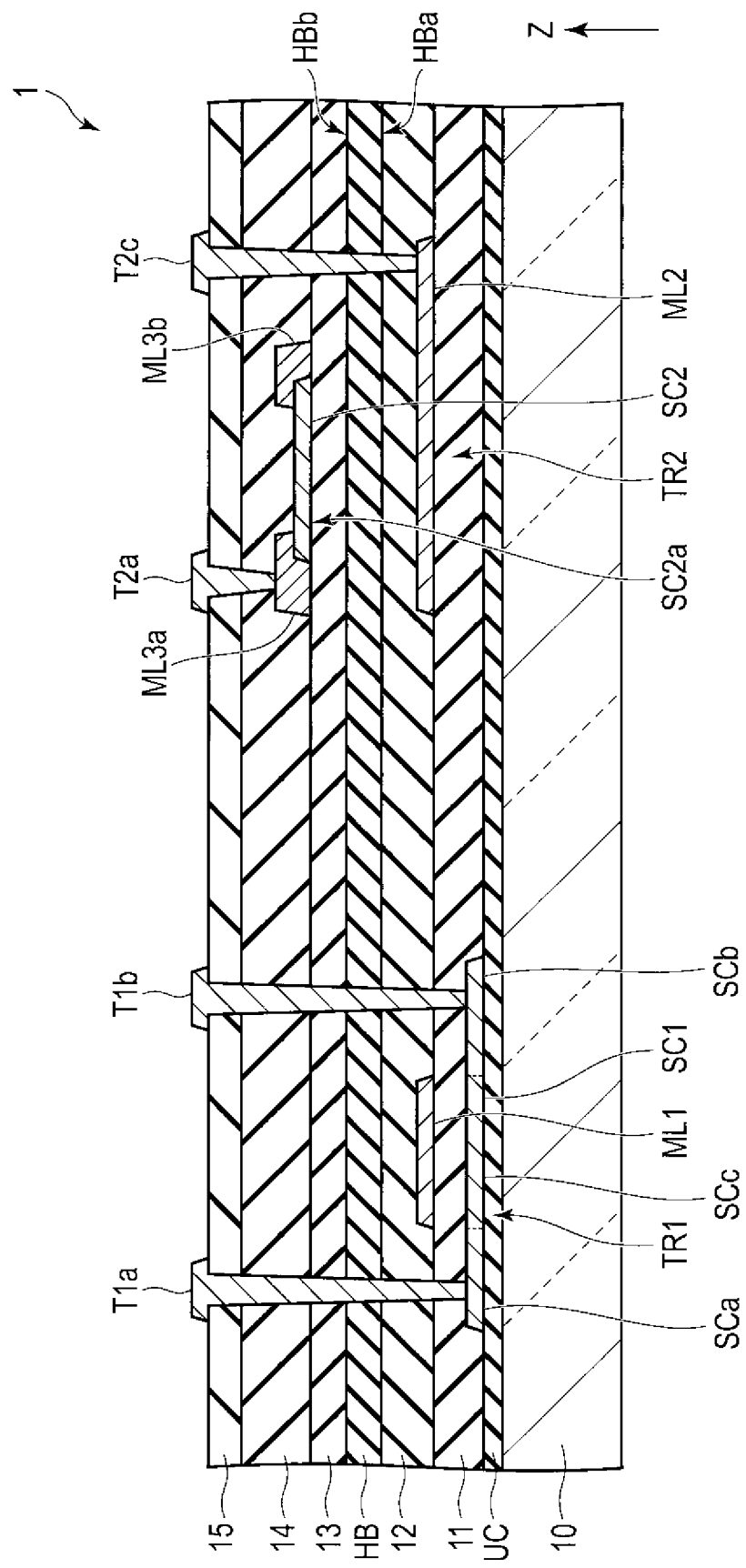
FIG. 3 is a cross-sectional view of a variation in which the block layer is disposed in a different position.

FIG. 3 is a cross-sectional view of a variation in which the block layer is disposed in a different position.

The insulating film 13 is disposed between the block layer HB and the semiconductor layer SC2 in this variation, and in this respect, the variation differs from the example of FIG. 1. In the example depicted, the block layer HB is disposed on the insulating film 12 and the insulating film 13 is disposed on the block layer HB, and the semiconductor layer SC2 is disposed on the insulating film 13. That is, the insulating film 13 contacts the upper surface HBb of the block layer HB and the lower surface SC2a of the semiconductor layer SC2.

In this variation, the hydrogen diffusion form the insulating film 12 to the insulating film 13 can be suppressed. That is, the hydrogen diffusion can be suppressed in a position closer to the hydrogen supplier.

Figure 4:
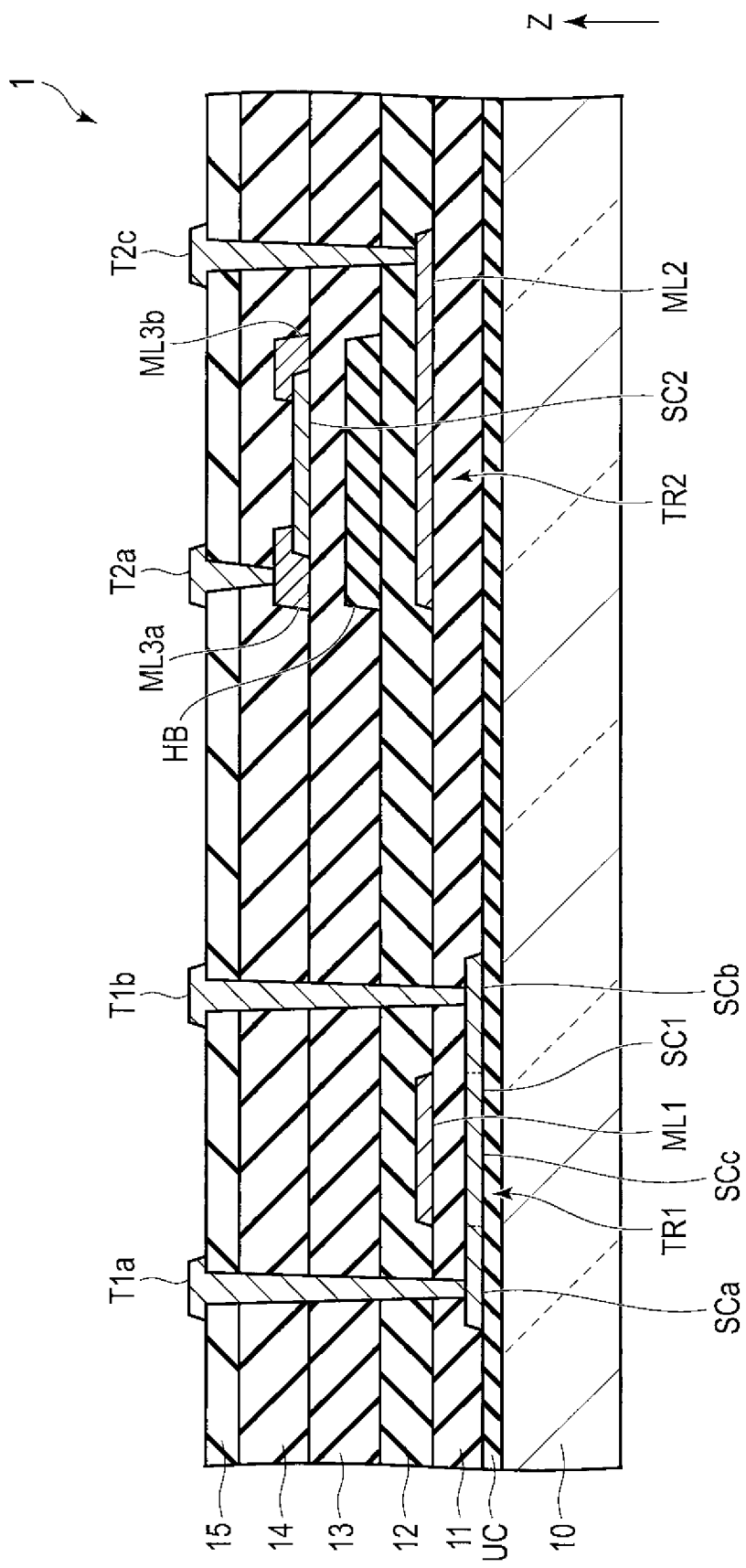
FIG. 4 is a cross-sectional view of a variation in which the block layer is patterned.

FIG. 4 is a cross-sectional view of a variation in which the block layer is patterned.

In this variation, the block layer HB is patterned as islands, and in this respect, the variation differs from the variation of FIG. 3. The advantages obtained in the variation of FIG. 2 can be achieved in this variation.

FIG. 5 is a cross-sectional view of a variation in which the thin film transistor TR2 is of top gate structure.

In this variation, a gate electrode ML4 is disposed to be opposed to the semiconductor layer SC2, and in this respect, this variation differs from the example of FIG. 1.

The gate electrode ML4 is disposed above the semiconductor layer SC2, and in the example depicted, the gate electrode ML4 is disposed between the insulating film 14 and the insulating film 15. In the example depicted, a light shielding layer SH is disposed below the semiconductor layer SC2 to be opposed to the semiconductor layer SC2. The light shielding layer SH and the gate electrode ML1 are disposed on the same layer (insulating film 11), and can be formed through the same manufacturing process with the same material used for the gate electrode ML1. The light shielding layer SH can block the light entering into the semiconductor layer SC2 if the light from the below is incident on the semiconductor device 1. Furthermore, in the example depicted, the insulating film 14 is patterned as with the gate electrode ML4; however, it may be formed on the entire surface as with the insulating film 15.

In this variation, the semiconductor device 1 can suppress the degradation of performance of the thin film transistor TR2 by light leakage current.

Now, variations of the present embodiment will be explained with reference to FIGS. 6 to 8. Note that the same advantages obtained in the above embodiment can be achieved in these variations.

Figure 6:
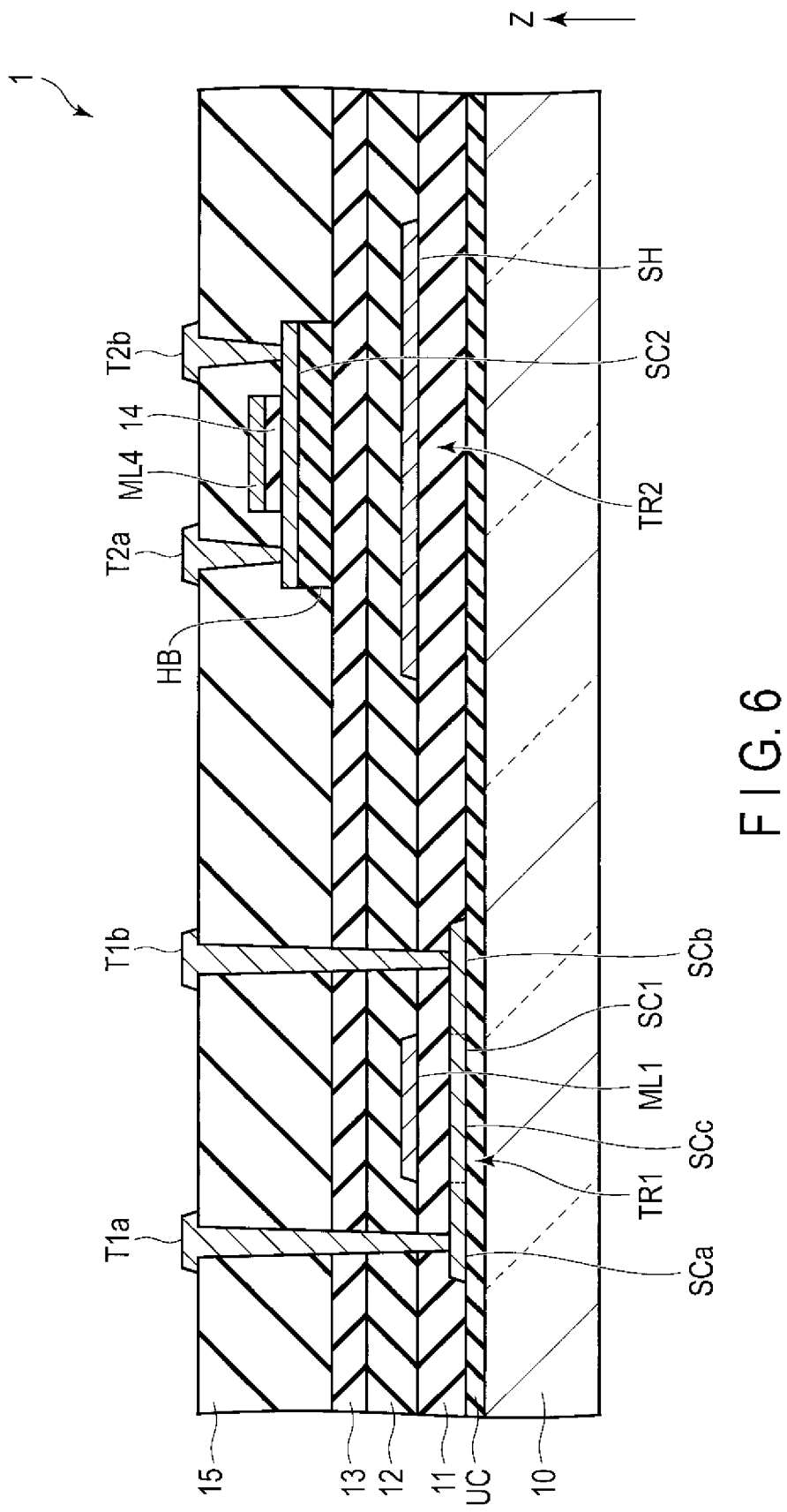
FIG. 6 is a cross-sectional view of a variation in which the block layer is patterned based on the variation of FIG. 5.

FIG. 6 is a cross-sectional view of a variation in which the block layer is patterned.

In this variation, the block layer HB is patterned as islands, and in this respect, the variation differs from the variation of FIG. 5.

In the variation, the block layer HB is formed as islands in the area opposed to the entire surface of the semiconductor layer SC2. The block layer HB is not formed in the other area, and is not opposed to, for example, the semiconductor layer SC1. The block layer HB depicted is patterned using the semiconductor layer SC2 as a mask. Note that, if the block layer HB is formed in an island shape, the area of the block layer HB is preferably formed at least greater than the area of the semiconductor layer SC2 in order to block hydrogen entering the semiconductor layer SC2.

In this variation, the block layer HB is patterned as islands, and the number of interfaces in the areas between thin film transistors can be reduced. Thereby, the transmissivity of the areas between the thin film transistors can be improved in this variation.

Figure 7:
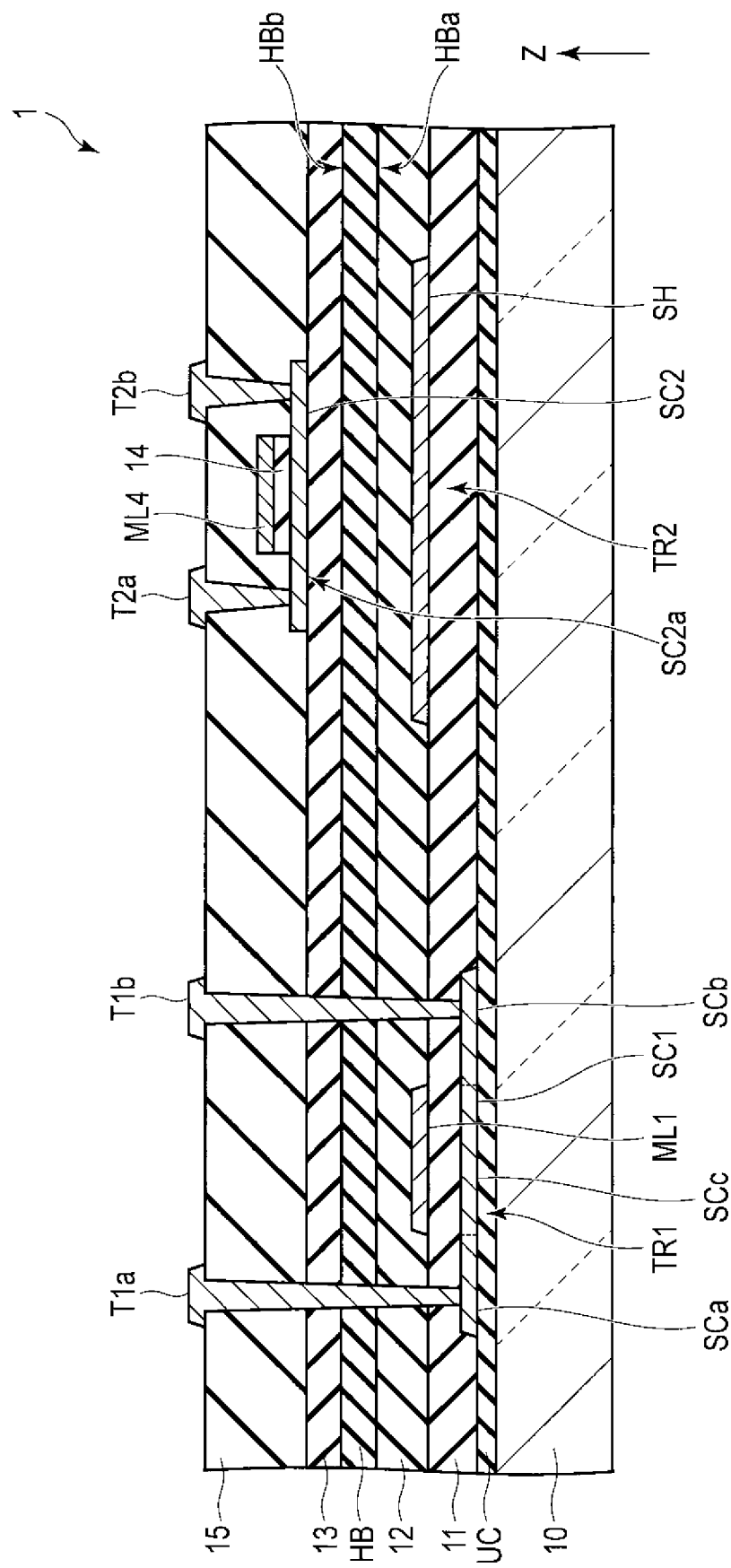
FIG. 7 is a cross-sectional view of a variation in which the block layer is disposed in a different position based on the variation of FIG. 5.

FIG. 7 is a cross-sectional view of a variation in which the block layer is disposed in a different position.

The insulating film 13 is disposed between the block layer HB and the semiconductor layer SC2 in this variation, and in this respect, the variation differs from the example of FIG. 5.

In the example depicted, the block layer HB is disposed on the insulating film 12 and the insulating film 13 is disposed on the block layer HB, and the semiconductor layer SC2 is disposed on the insulating film 13. That is, the insulating film 13 contacts the upper surface HBb of the block layer HB and the lower surface SC2a of the semiconductor layer SC2.

In this variation, the hydrogen diffusion from the insulating film 12 to the insulating film 13 can be suppressed.

Figure 8:
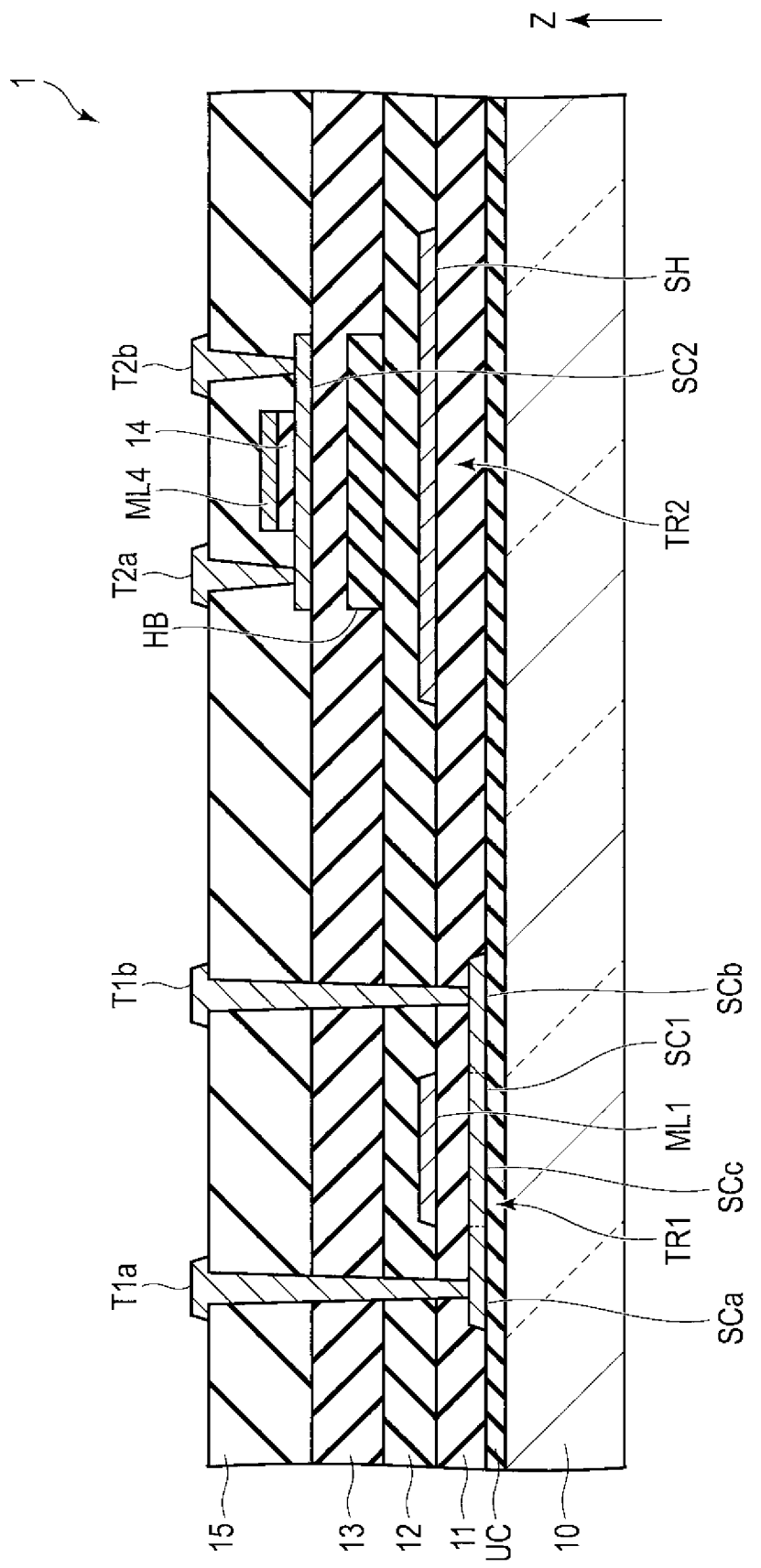
FIG. 8 is a cross-sectional view of a variation in which the block layer is patterned based on the variation of FIG. 5.

FIG. 8 is a cross-sectional view of a variation in which the block layer is patterned.

In this variation, the block layer HB is formed as islands, and in this respect, the variation differs from the variation of FIG. 7.

In the example depicted, the block layer HB is disposed on the insulating film 12 and is formed as islands in the area opposed to the entire surface of the semiconductor layer SC2. The block layer HB is not formed in the other area, and is not opposed to, for example, the semiconductor layer SC1. The insulating film 13 is disposed on the insulating film 12 and is partly disposed on the block layer HB formed as islands. That is, the insulating film 13 partly contacts the upper surface HBb of the block layer HB and the lower surface SC2a of the semiconductor layer SC2.

In this variation, the advantages obtained in the variation of FIG. 6 can be achieved.

Now, an example where the semiconductor device 1 is applied to a display device DSP will be explained.

Figure 9:
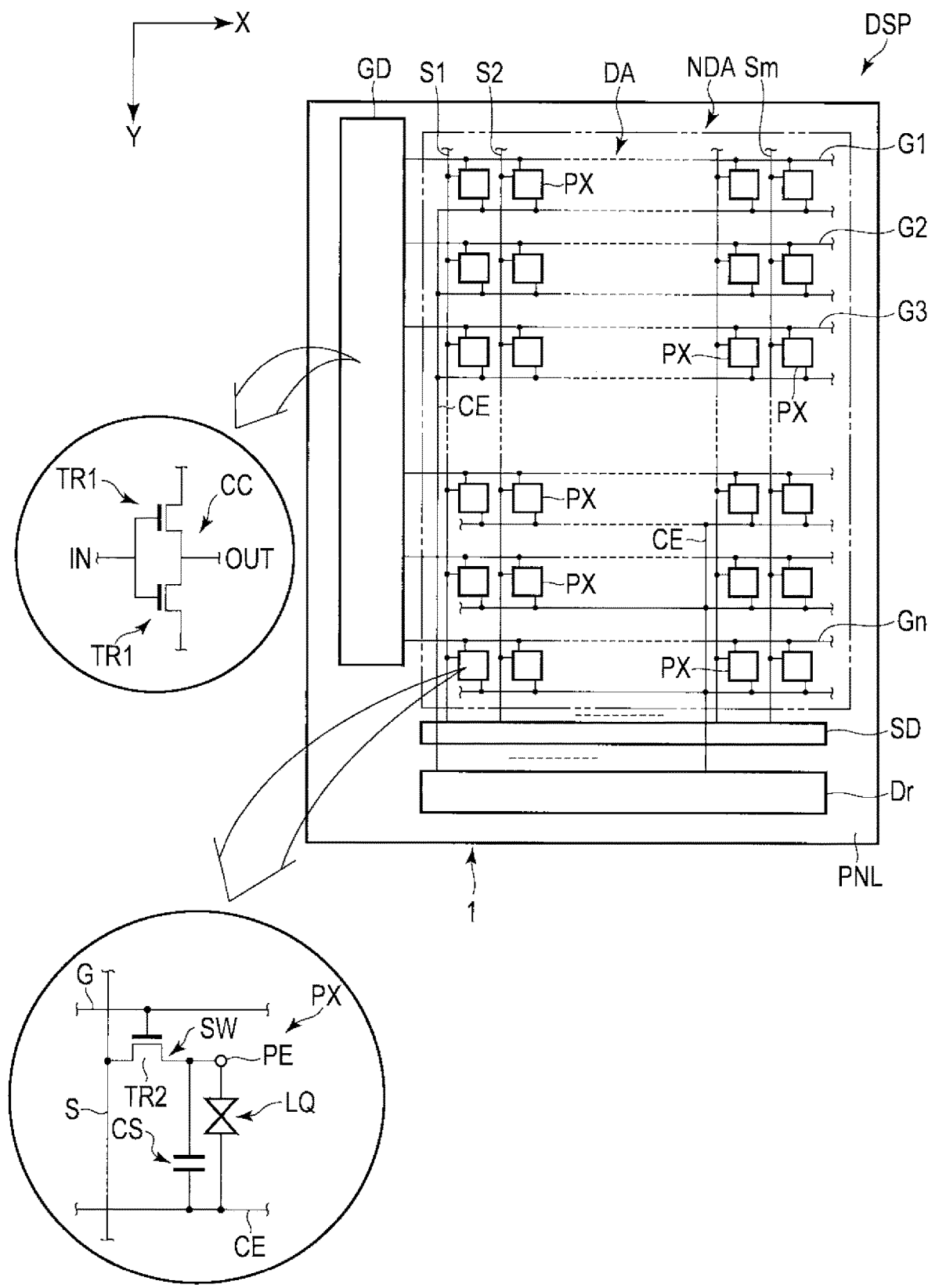
FIG. 9 shows a display device including the semiconductor device of the embodiment.

FIG. 9 shows the structure of the display device including the semiconductor device of the present embodiment. The display device DSP is, for example, a liquid crystal display device; however, it may be a different display device such as organic electroluminescent (EL) display device.

The display panel PNL includes a semiconductor device 1. The display panel PNL includes a display area DA used for image display and a non-display area NDA disposed around the display area DA. The display device DSP includes, in the non-display area NDA, a drive circuit Dr, signal line drive circuit SD, scan line drive circuit GD, and the like.

The display panel PNL includes a plurality of pixels PX in the display area DA. Note that the display panel PNL includes a plurality of scan lines G (G1 to Gn) and a plurality of signal lines S (S1 to Sm) in the display area DA.

Scan lines G are drawn to the outside of the display area DA and are connected to the scan line drive circuit GD. The scan line drive circuit GD includes complementary TFT elements CC. Signal lines S are drawn to the outside of the display area DA and are connected to the signal line drive circuit SD. The common electrode CE is shared by the pixels PX. The common electrode CE is drawn to the outside of the display area DA and is connected to the drive circuit Dr. Each of the drive circuits GD, SD, and Dr is used to control the electric signal supply to the display area DA through the scan line G, signal line S, and common electrode CE.

Each pixel PX includes, for example, a switching element SW, pixel electrode pE, common electrode CE, and liquid crystal layer LQ. The switching element SW is formed of, for example, a thin film transistor. The switching element SW is electrically connected to a scan line G and a signal line S to control the luminosity of pixel PX. The pixel electrode PE is electrically connected to the switching element SW. The pixel electrode PE is opposed to the common electrode CE. A capacitance CS is formed, for example, between the common electrode CE and the pixel electrode PE.

In the example depicted, the complementary TFT element CC is formed of a thin film transistor TR1 and the switching element SW is formed of a thin film transistor TR2. The thin film transistor TR1 is not limited to the complementary TFT element CC, and it may be used as a p-type TFT element or an n-type TFT element. The thin film transistor TR1 is not limited to the scan line drive circuit GD, and it may be included in the signal line drive circuit SD or in the drive circuit Dr. Furthermore, the thin film transistor R1 may form a switching element SW and the thin film transistor TR2 may form a peripheral drive circuit such as drive circuit Dr, signal line drive circuit SD, and scan line drive circuit GD.

As can be understood from the above, the display device DSP includes a semiconductor device 1 of the embodiment. A change in a threshold voltage is less in the thin film transistor TR1 than is in the thin film transistor TR2, for example. On the other hand, the thin film transistor TR2 has an off-current less than that of the thin film transistor TR1, for example. That is, in the display device DSP, the thin film transistor TR1 of high reliability can be arranged in the peripheral circuit while the thin film transistor TR2 which can suppress leakage of charge can be arranged in pixels PX. Therefore, the present embodiment can present a display device DSP of high reliability and low power consumption. Since the semiconductor device 1 includes thin film transistors TR1 and TR2 of different properties on a single substrate, the thin film transistors TR1 and TR2 can arbitrarily arranged to correspond to requirements of the TFTs.

As explained above, the present embodiment can achieve a semiconductor device which can suppress degradation of reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an insulating substrate;
   a metal oxide semiconductor layer positioned above the insulating substrate;
   a first insulating film formed of a silicon nitride and positioned between the insulating substrate and the metal oxide semiconductor layer;
   a block layer positioned between the first insulating film and the metal oxide semiconductor layer, the block layer being formed of aluminum oxide;
   a second insulating film formed of a silicon oxide between the first insulating film and the block layer;
   a third insulating film formed of a silicon oxide, positioned above the metal oxide semiconductor layer, and covering the metal oxide semiconductor layer;
   an interlayer insulating film formed of a silicon oxide between the first insulating film and the insulating substrate; and
   a first gate electrode located between the first insulating film and the interlayer insulating film, and facing the metal oxide semiconductor layer via the first insulating film and the second insulating film, wherein the second insulating film contacts a lower surface of the block layer, and the third insulating film is formed thicker than the first insulating film, the second insulating film, and the interlayer insulating film.

2. The semiconductor device of claim 1, further comprising a silicon semiconductor layer positioned above the insulating substrate.

3. The semiconductor device of claim 2, wherein the block layer continuously extends to a position opposed to the silicon semiconductor layer and a position opposed to the metal oxide semiconductor layer.

4. The semiconductor device of claim 2, wherein the metal oxide semiconductor layer is in a position which is not opposed to the silicon semiconductor layer with the first insulating film and the second insulating film interposed therebetween, and the block layer continuously extends from a position opposed to the silicon semiconductor layer to a position opposed to the metal oxide semiconductor layer.

5. The semiconductor device of claim 4, wherein the block layer is thicker in an area opposed to the metal oxide semiconductor layer than in an area opposed to the silicon semiconductor layer.

6. The semiconductor device of claim 5, wherein the block layer includes an upper surface of an area opposed to the silicon semiconductor layer which contacts a lower surface of the metal oxide semiconductor layer.

7. The semiconductor device of claim 2, wherein the block layer is formed as an island opposed to the entire surface of the metal oxide semiconductor layer without being opposed to the silicon semiconductor layer.

8. The semiconductor device of claim 2, further comprising:

a first second gate electrode opposed to the silicon semiconductor layer; wherein the second gate electrode positioned in the same layer in which the first gate electrode is disposed, the first gate electrode formed of the same material used for the first second gate electrode.

9. The semiconductor device of claim 8, wherein the interlayer insulating film is positioned between the silicon semiconductor layer and the first insulating film and contacts an upper surface of the silicon semiconductor layer and a lower surface of the first insulating film.

10. The semiconductor device of claim 2, further comprising:

a second gate electrode opposed to the silicon semiconductor layer; wherein the second gate electrode formed of the same material used for the first gate electrode.

11. The semiconductor device of claim 10, wherein the second gate electrode contacts an upper surface of the interlayer insulating film and is covered with the first insulating film, and the first gate electrode contacts the upper surface of the interlayer insulating film and is covered with the first insulating film.

12. The semiconductor device of claim 10, wherein the interlayer insulating film contacts an upper surface of the silicon semiconductor layer and a lower surface of the first gate electrode.

13. The semiconductor device of claim 1, further comprising a fourth insulating film formed of a silicon nitride, positioned above the third insulating film, and having a water vapor barrier property.

14. The semiconductor device of claim 1, wherein the metal oxide semiconductor layer contacts an upper surface of the block layer.

15. A semiconductor device comprising:

an insulating substrate;

a metal oxide semiconductor layer positioned above the insulating substrate;

a first insulating film formed of a silicon nitride and positioned above the insulating substrate;

a block layer positioned between the first insulating film and the metal oxide semiconductor layer, hydrogen diffusion of the block layer being lower than that of the first insulating film, a second insulating film formed of a silicon oxide between the first insulating film and the block layer;

a third insulating film formed of a silicon oxide, positioned above the a metal oxide semiconductor layer, and covering the metal oxide semiconductor layer;

an interlayer insulating film formed of a silicon oxide between the first insulating film and the insulating substrate; and a first gate electrode located between the first insulating film and the interlayer insulating film, and facing the metal oxide semiconductor layer via the first insulating film and the second insulating film, wherein the second insulating film contacts a lower surface of the block layer, and the third insulating film is formed thicker than the first insulating film, the second insulating film, and the interlayer insulating film.

* * * * *